United States Patent
Fukase et al.

(10) Patent No.: US 7,388,293 B2
(45) Date of Patent: Jun. 17, 2008

(54) INTERPOSER METHOD OF FABRICATING SAME, AND SEMICONDUCTOR DEVICE USING THE SAME HAVING TWO PORTIONS WITH DIFFERENT CONSTRUCTIONS

(75) Inventors: Katsuya Fukase, Nagano (JP); Shinichi Wakabayashi, Nagano (JP)

(73) Assignee: Shinko Electric Industries, Co., Nagano-shi (JP)

( * ) Notice: Subject to any disclaimer, the term of this patent is extended or adjusted under 35 U.S.C. 154(b) by 0 days.

(21) Appl. No.: 11/151,193

(22) Filed: Jun. 14, 2005

(65) Prior Publication Data

US 2006/0001179 A1 Jan. 5, 2006

(30) Foreign Application Priority Data

Jun. 30, 2004 (JP) .............................. 2004-193490

(51) Int. Cl.
*H01L 23/52* (2006.01)
*H01L 23/48* (2006.01)

(52) U.S. Cl. .............................. 257/774; 257/E23.008; 257/E23.026; 257/E23.067; 257/E23.205; 257/E25.013; 257/668; 257/773; 257/701; 257/702; 257/703; 257/685; 257/698; 257/690; 257/691; 257/692; 257/693; 257/778; 257/738; 257/737; 257/686; 257/723

(58) Field of Classification Search ......... 257/E23.005, 257/E23.008, E23.026, E23.067, E23.105, 257/774, 773, 778, 737, 690–693, 738, 734, 257/685, 686, 723, 698

See application file for complete search history.

(56) References Cited

U.S. PATENT DOCUMENTS

| | | | | |
|---|---|---|---|---|
| 5,325,265 A | * | 6/1994 | Turlik et al. | 361/702 |
| 6,265,772 B1 | | 7/2001 | Yoshida | 257/712 |
| 6,507,497 B2 | * | 1/2003 | Mashino | 361/767 |
| 6,525,407 B1 | | 2/2003 | Drewery | 257/666 |
| 6,529,027 B1 | * | 3/2003 | Akram et al. | 324/758 |
| 6,767,757 B2 | * | 7/2004 | Kang et al. | 438/48 |
| 6,831,367 B2 | * | 12/2004 | Sekine | 257/774 |
| 6,858,892 B2 | * | 2/2005 | Yamagata | 257/300 |
| 6,911,733 B2 | * | 6/2005 | Kikuchi et al. | 257/728 |
| 6,927,427 B2 | * | 8/2005 | Ladiray | 257/119 |

(Continued)

FOREIGN PATENT DOCUMENTS

JP  2001-326305  11/2001

(Continued)

*Primary Examiner*—Alexander Oscar Williams
(74) *Attorney, Agent, or Firm*—Edwards Angell Palmer & Dodge LLP (57) ABSTRACT

An interposer to be interposed between a semiconductor chip to be mounted thereon and a packaging board has an interposer portion made of a semiconductor material and an interposer portion provided around the foregoing interposer portion integrally therewith. On both surfaces of the interposer portions, wiring patterns are formed via insulating layers. The wiring patterns are electrically connected via through holes formed at required positions in the interposer portions. The outer interposer portion is made of an insulator or a metal body. Further, external connection terminals are bonded to one surface of the interposer.

10 Claims, 11 Drawing Sheets

U.S. PATENT DOCUMENTS

| | | | |
|---|---|---|---|
| 7,078,269 B2 * | 7/2006 | Yamasaki et al. | 438/121 |
| 2001/0028114 A1 | 10/2001 | Hosomi | 257/778 |
| 2002/0020898 A1 | 2/2002 | Vu et al. | 257/676 |
| 2003/0103338 A1 | 6/2003 | Vandentop et al. | 361/767 |
| 2004/0180540 A1 * | 9/2004 | Yamasaki et al. | 438/667 |
| 2005/0093095 A1 * | 5/2005 | Yamagata | 257/532 |
| 2006/0234420 A1 | 10/2006 | Yokozuka et al. | 438/106 |

FOREIGN PATENT DOCUMENTS

| | | |
|---|---|---|
| WO | WO 02/15266 | 2/2002 |
| WO | WO 2004/047168 | 6/2004 |

* cited by examiner

STEPS OF FIGS. 4A-5A

INTERPOSER METHOD OF FABRICATING SAME, AND SEMICONDUCTOR DEVICE USING THE SAME HAVING TWO PORTIONS WITH DIFFERENT CONSTRUCTIONS

CROSS-REFERENCE TO RELATED APLICATIONS

This application is based on and claims priority of Japanese Patent Application No. 2004-193490 filed on Jun. 30, 2004, the entire contents of which are incorporated herein by reference.

BACKGROUND OF THE INVENTION (a) Field of the Invention

The present invention relates to an interposer for a semiconductor device, more particularly, to an interposer adapted to realize a required fan-out structure between a semiconductor chip to be mounted thereon and a printed wiring board (packaging board) such as a mother board. The present invention also relates to a method of fabricating the interposer, and a semiconductor device using the same.

Such an interposer has a function of mounting a semiconductor chip thereon, and is therefore the same as a wiring board in terms of function and also referred to as a "package."

(b) Description of the Related Art

A typical interposer has a semiconductor chip (typically a silicon (Si) chip) mounted thereon, and is mounted on a printed wiring board to constitute a semiconductor device. As a material constituting the interposer, various materials have been used. One example thereof is silicon (Si). The reason for using Si is that Si is the same material as that constituting the semiconductor chip to be mounted thereon is used (i.e., the coefficients of thermal expansion (CTEs) thereof are made approximately equal to each other) to prevent the occurrence of disadvantages such as a warp or a twist resulting from a difference in thermal shrinkage therebetween.

The interposer in which Si is used as its constituent material has an advantage in that the CTE thereof matches with that of the Si chip to be mounted thereon. In this case, from the viewpoint of CTE matching, it suffices that the size of the Si interposer is approximately the same as the size of the chip. However, the pitch of external connection terminals to be provided on the opposite surface to the side where the chip is to be mounted is greater than the pitch of terminals of the chip. Accordingly, the size of the interposer becomes larger than the size of the chip. In particular, where a chip having a large number of terminals is to be mounted, the size of the interposer becomes even larger. Namely, because the interposer is used to match the terminals of the Si chip to be mounted thereon and the terminals (external connection terminals) for connecting with a printed wiring board (i.e., to perform rewiring), the interposer exhibits a form in which an area for the external connection terminals is extended to the periphery of a chip mount area, i.e., a so-called "fan-out structure," from the viewpoint of structure.

Moreover, when such a Si interposer is fabricated in a conventional process, a series of processings (formation of through holes, formation of an insulating layer in the through holes and on the wafer surface, formation of a seed layer or the like on the insulating layer, filling of the through holes with conductors by plating, formation of plated layers on both surfaces and formation of electrical paths between the both surfaces, formation of wiring patterns on the both surfaces, formation of protective films, and the like) are performed on a whole Si wafer, and then the Si wafer is diced into individual pieces (divided into individual pieces), each corresponding to one interposer. Further, external connection terminals are bonded thereto, as needed. Namely, the formation of wiring patterns is performed on the whole Si wafer.

Technologies relating to the above-described conventional technology include, for example, as described in Japanese unexamined Patent Publication (JPP) 2001-326305, an interposer for a semiconductor device in which a capacitor is provided between wiring patterns directly under a semiconductor chip to be mounted thereon.

As described above, conventional interposers have a "fan-out structure" in which an area occupied by external connection terminals is extended to the periphery of a chip mount area. Accordingly, there has been the following problem: where an interposer is fabricated using only silicon (Si), Si needs to be used even for an area which is essentially unnecessary from the viewpoint of CTE matching with a Si chip to be mounted thereon, i.e., an area extended to the periphery of the chip mount area; consequently, cost is increased.

Moreover, when an interposer is fabricated in a conventional process, processing is performed on the whole Si wafer until the Si wafer is finally divided into individual pieces. Accordingly, there has also been the problem in that it is technically difficult to form wiring patterns having required shapes on both surfaces of the Si wafer.

SUMMARY OF THE INVENTION

An object of the present invention is to provide an interposer which can realize a required fan-out structure and reduce a cost thereof.

Another object of the present invention is to provide an interposer fabrication method by which required wiring patterns can be easily formed on both surfaces of the interposer, and also to provide a semiconductor device constituted using the interposer.

To attain the above objects, according to one aspect of the present invention, there is provided an interposer to be interposed between a semiconductor chip to be mounted thereon and a packaging board, the interposer including: a first interposer portion made of a semiconductor; and a second interposer portion made of an insulator and provided around the first interposer portion in a plane thereof integrally with the first interposer portion, wherein wiring patterns formed via insulating layers, respectively, on both surfaces of the first and second interposer portions, are electrically connected via through holes formed at required positions in the first and second interposer portions.

According to the construction of the interposer of this aspect, the first interposer portion is made of a semiconductor necessary for matching its coefficient of thermal expansion (CTE) with that of the semiconductor chip to be mounted thereon, and the second interposer portion provided in an area (i.e., an area which is essentially unnecessary from the viewpoint of CTE matching with the semiconductor chip to be mounted thereon) around the first interposer portion is made of an insulator. Accordingly, a semiconductor (typically, Si) does not need to be used for an unnecessary area as heretofore, and the amount of a semiconductor used can be reduced to a required minimum.

Thus, cost can be reduced. Further, the presence of the second interposer portion makes it possible to realize a required fan-out structure.

Moreover, in the interposer according to the above-described aspect, instead of the second interposer portion made of an insulator, a second interposer portion being made of a metal may be provided.

In this case, when the interposer is constituted as a semiconductor device, heat generated inside can be dissipated into the outside environment through the metal body (second interposer portion). Namely, the second interposer portion functions as a kind of heat spreader.

Also, according to another aspect of the present invention, there is provided a method of fabricating an interposer of the above aspect. One aspect of the method includes the steps of: forming first through holes at required positions in a semiconductor wafer; forming a first insulating layer on the entire surface of the semiconductor wafer, including inner walls of the first through holes, and then forming a first wiring pattern having a required shape on each surface of the semiconductor wafer, including insides of the first through holes; dicing the semiconductor wafer with the first wiring pattern formed thereon into individual shapes of first interposer portions; arranging the diced first interposer portions at a predetermined regular interval therebetween on a second insulating layer formed on one surface of a supporting body; forming an insulator layer filling respective gaps between the first interposer portions, and further forming a third insulating layer over the insulator layer and the first interposer portions; removing the supporting body, then forming second through holes piercing from the third insulating layer to the second insulating layer at required positions in the insulator layer, and forming via holes reaching pad portions delimited at required positions in the first wiring patterns; forming second wiring patterns having required shapes, the second wiring patterns electrically connecting both surfaces of the insulator layer via the second through holes and filling the via holes to be electrically connected to the pad portions of the first wiring patterns; and forming protective films on both surfaces of the first interposer portions and the insulator layer in such a manner that pad portions delimited at required positions in the second wiring patterns are exposed, and further cutting portions of the insulator layer to delimit specified areas for the second interposer portions into separate pieces, each piece including one of the first interposer portions.

In addition to the advantages obtained by the interposer according to the above aspect, the interposer fabrication method according to this aspect further provides the advantage in that required wiring patterns can be easily formed on both surfaces of an interposer, unlike the case where processing is performed on the whole Si wafer as heretofore, because processing is performed after the first interposer portions have been diced (cut and separated) from the semiconductor wafer and re-laid out on the supporting body.

Also, according to still another aspect of the present invention, there is provided a semiconductor device in which a semiconductor chip is mounted on the interposer according to any one of the above aspects and electrically connected to the wiring patterns. Furthermore, a required number of semiconductor devices, each being according to this aspect, may be stacked and electrically connected to each other.

DESCRIPTION OF THE PREFERRED EMBODIMENTS

Figure 1:
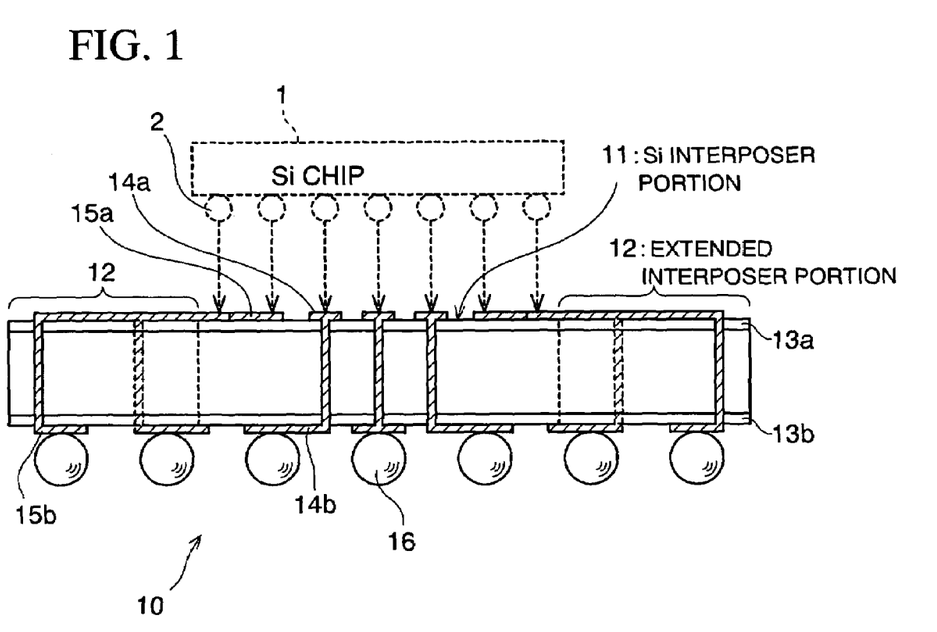
FIG. 1 is a cross-sectional view schematically showing the constitution of an interposer (in the case of an extended interposer portion being made of an insulator) according to one embodiment of the present invention.

FIG. 1 schematically shows, in a cross-sectional view, the constitution of an interposer according to one embodiment of the present invention. In the illustrated example, in order to clearly show the portions relating to the present invention, the constitution of the interposer is shown in a simplified manner. The detailed constitution (structure) thereof will be described later in conjunction with the process.

On the interposer 10 according to this embodiment, a silicon (Si) chip 1 is mounted as indicated by dashed lines in the drawing. As described later, the interposer 10 with the Si chip 1 mounted thereon is mounted on a packaging board to constitute a semiconductor device. The interposer 10 has, as its basic structure, a portion 11 (hereinafter referred to as a "Si interposer portion") which is made of Si necessary for matching its coefficient of thermal expansion (CTE) with that of the Si chip 1 to be mounted thereon, and a portion 12 (hereinafter referred to as an "extended interposer portion") which is extended to the periphery (around the Si interposer portion 11 in the plane thereof) of a chip mount area in order to realize a required fan-out structure. The Si interposer portion 11 and the extended interposer portion 12 are integrally provided. The Si interposer portion 11 has a size approximately equal to that of the Si chip 1 to be mounted thereon, when viewed two-dimensionally. Further, the extended interposer portion 12 is made of an insulator. In this embodiment, epoxy resin is used in consideration of cost (reduction in cost) and processing (ease of processing).

Moreover, on both surfaces of the Si interposer portion 11, wiring patterns (e.g., plated copper (Cu) layers) 14a and 14b are formed in required shapes with insulating layers 13a and 13b interposed therebetween, respectively. The wiring patterns 14a and 14b are electrically connected to each other via through holes formed at required positions in the Si interposer portion 11. Similarly, on both surfaces of the extended interposer portion 12, wiring patterns 15a and 15b are formed in required shapes, respectively. The wiring patterns 15a and 15b are electrically connected to each other via through holes formed at required positions in the extended interposer portion 12. The through holes formed in the interposer portions 11 and 12 are filled with conductors (e.g., Cu). Alternatively, conductors are formed on the inner walls thereof. Further, although not clearly shown in FIG. 1, the wiring patterns 14a and 14b of the Si interposer portion 11 and the wiring patterns 15a and 15b of the extended interposer portion 12 are connected to each other at required positions.

Each of the wiring patterns 14a, 14b, 15a, and 15b is formed to include pad portions at required positions. In the constitution according to this embodiment, the wiring patterns 14a and 15a on the side where the Si chip 1 is to be mounted are formed in such a manner that pad portions are delimited at positions corresponding to the positions of electrode terminals 2 (e.g., solder bumps or gold (Au) stud bumps) of the Si chip 1 to be mounted, and the wiring patterns 14b and 15b on the opposite side are formed in such a manner that pad portions are delimited at positions corresponding to the bonding positions of external connection terminals 16 (e.g., solder bumps) which are to be used when the interposer 10 is mounted on a packaging board. In the illustrated example, the structure is shown in which one layer of wiring patterns 14a and 14b (15a and 15b) is formed on each surface of the interposer portion 11 (12). However, it is a matter of course that the number of wiring layers may be further increased by a build-up process or the like, as needed.

Moreover, although not clearly shown in FIG. 1, protective films (e.g., solder resist layers) are formed on both surfaces of the interposer portions 11 and 12 so as to cover the entire surface in such a manner that the pad portions of the wiring patterns 14a, 14b, 15a, and 15b are exposed. Furthermore, on the wiring patterns (pad portions) exposed from the protective films, plated layers of nickel (Ni)/gold (Au) are deposited. Incidentally, in the illustrated example, the external connection terminals 16 are provided, but these terminals do not necessarily need to be provided. It suffices that the pad portions (plated Ni/Au layers) are exposed from the protective films so that external connection terminals can be bonded thereto when necessary.

The interposer 10 according to this embodiment basically has the following features: there are integrally provided the Si interposer portion 11 having the size necessary for matching its CTE with that of the Si chip 1 to be mounted thereon, and the extended interposer portion 12 necessary to realize a required fan-out structure; and multilayer stacking can be realized using the pad portions exposed from the protective films or the external connection terminals bonded to the pad portions, as needed as described later.

In this embodiment, the interposer portion 11 made of Si is provided as a component for performing CTE matching with the Si chip 1. However, it is a matter of course that the material of the interposer portion 11 is not limited to Si as long as it is a material having a CTE equivalent to that of the Si chip 1. For example, low firing temperature ceramic such as glass ceramic can be suitably used.

Figure 2:
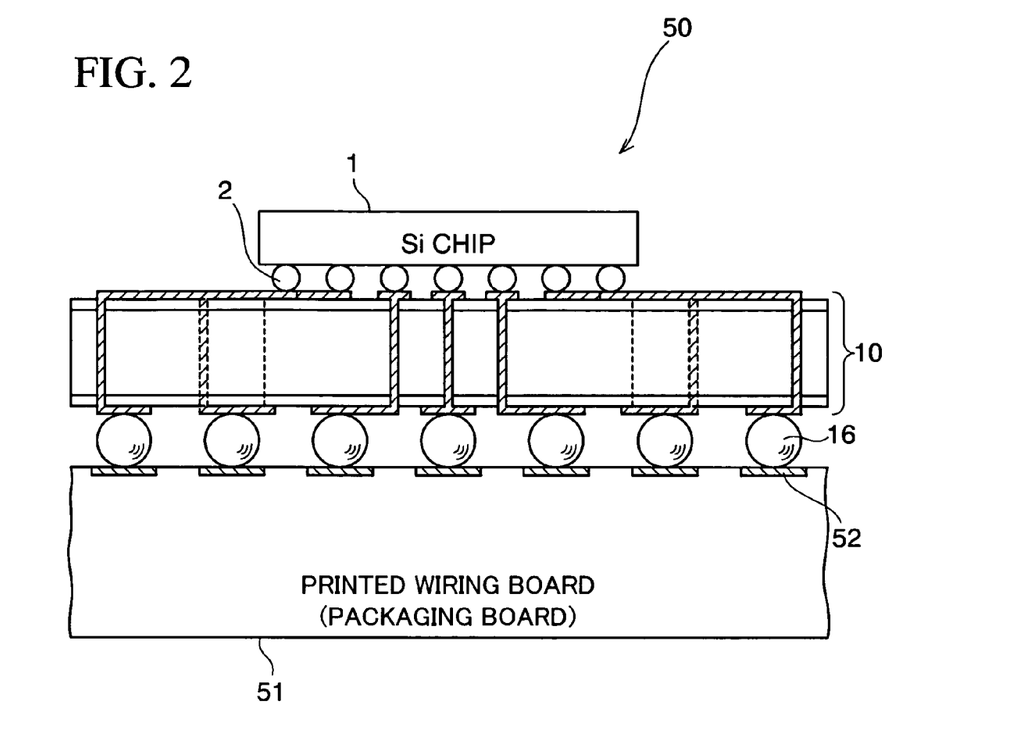
FIG. 2 is a cross-sectional view schematically showing one example of the constitution of a semiconductor device constituted using the interposer of FIG. 1.

FIG. 2 schematically shows one example of the constitution of a semiconductor device constituted using the interposer 10 according to the above-described embodiment.

The illustrated semiconductor device 50 is constituted by mounting the interposer 10 with the Si chip 1 mounted thereon on a printed wiring board (packaging board) 51 such as a mother board. When the Si chip 1 is mounted on the interposer 10, for example, the flip-chip bonding of the chip is performed in such a manner that the electrode terminals 2, such as solder bumps, which are bonded to the pads of the Si chip 1 are electrically connected to the pad portions of the wiring pattern which are exposed from the solder resist layer (protective film) on the upper side, and furthermore, underfill resin (e.g., epoxy resin) is filled into the space between the chip and the solder resist layer, and cured, whereby the Si chip 1 is bonded to the interposer 10. In this case, the flip-chip bonding and the filling of the underfill resin can also be simultaneously performed. Further, when the interposer 10 is mounted on the printed wiring board 51, in a similar way, solder balls to serve as external connection terminals (solder bumps 16) are bonded by reflow to the pad portions of the wiring patterns which are exposed from the solder resist layer (protective film) on the lower side, and the pad portions are connected via the solder bumps 16 to corresponding pads or lands 52 on the printed wiring board 51.

Figure 3:
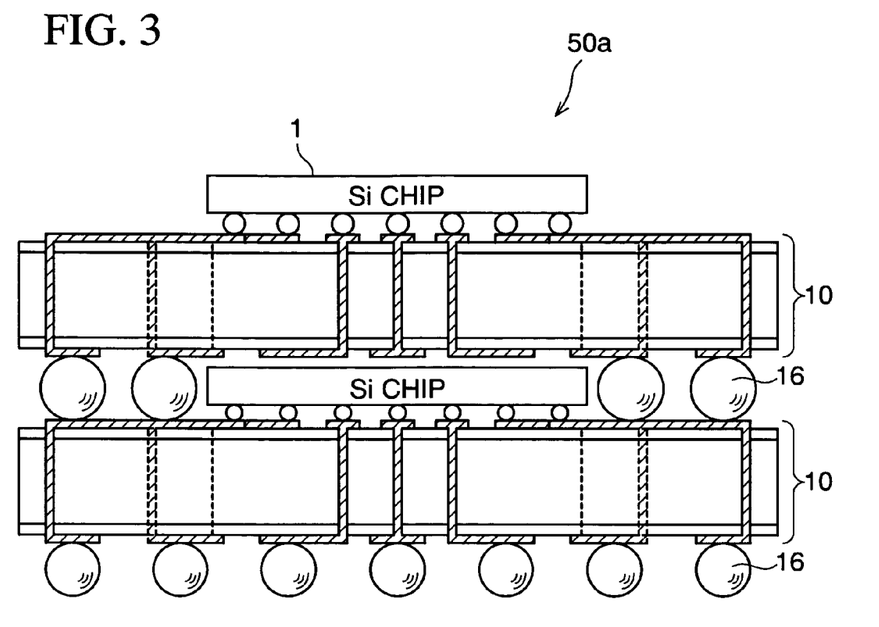
FIG. 3 is a cross-sectional view schematically showing another example of the constitution of a semiconductor device constituted using the interposer of FIG. 1.

FIG. 3 schematically shows another example of the constitution of a semiconductor device constituted using the interposer 10 according to the above-described embodiment. The illustrated semiconductor device 50a has a structure in which a plurality of interposers 10 (two interposers in the illustrated example) with Si chips 1 mounted thereon are electrically connected to each other and stacked in a multilayered manner. In this case, the electrical connection between the interposers 10 is established via the pad portions (on the upper side) of the lower interposer 10 and the external connection terminals 16 bonded to the pad portions (on the lower side) of the upper interposer 10. Note that the printed wiring board (packaging board) 51 shown in FIG. 2 is not shown in the example shown in FIG. 3.

Moreover, although not particularly shown in the drawing, in consideration of adaptability to a multi-chip module, a semiconductor device can also be constituted in the constitution in which a plurality of interposers 10 according to this embodiment are two-dimensionally arranged.

Next, a method of fabricating the interposer 10 according to this embodiment will be described with reference to FIGS. 4A to 6C showing one example of a fabricating process thereof. In the cross-sectional constitutions shown in FIGS. 4A to 6C, for simplification of illustration, only (part of) the Si interposer portion 11 and (part of) the extended interposer portion 12 adjacent thereto are shown.

To begin with, in the first step (FIG. 4A), a Si wafer having a size of, for example, 12 inches, is prepared and thinned to a predetermined thickness (approximately 50 to 300 μm). Then, through holes TH1 are formed at required positions in this Si wafer 20 by dry etching, such as reactive ion etching (RIE) or sputter etching.

In the next step (FIG. 4B), an insulating layer 21 of $SiO_2$ (silicon oxide film) is formed on the entire surface including the inner walls of the through holes TH1, for example, by CVD or thermal oxidation.

In the next step (FIG. 4C), a seed layer 22 of copper (Cu) is formed on the entire surface of the insulating layer 21, for example, by electroless plating, sputtering, or vapor deposition.

In the next step (FIG. 4D), the through holes TH1 are filled with conductors, and wiring patterns 23 are formed in required shapes on both surfaces to be connected to the conductors. For example, using the seed layer 22 as a power-supplying layer, the through holes TH1 are filled by electrolytic Cu plating. Alternatively, conductive paste containing metal such as Cu is filled into the through holes TH1 by screen printing, inkjet printing, or the like. Further, the Cu wiring patterns 23 having required shapes are formed on the filled conductors by a subtractive process, a semi-additive process, inkjet printing, or the like. Where a semi-additive process or inkjet printing is used, the wiring patterns 23 can be formed simultaneously with the filling of the through holes TH1 with conductors (Cu). This contributes to a simplification of the process.

Figure 4A:
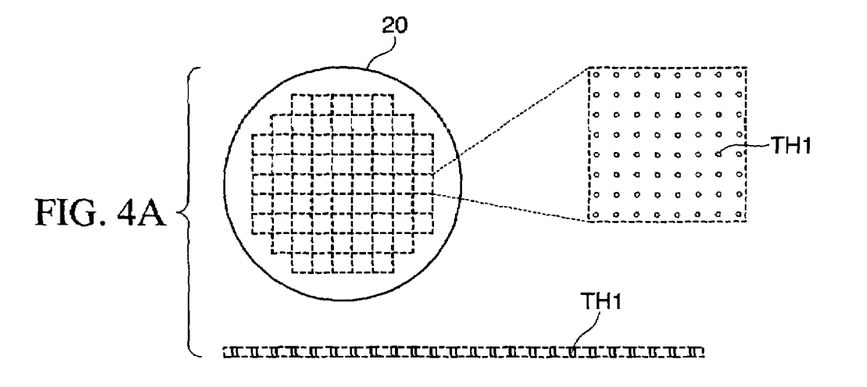
FIG. 4A is a plan view and FIGS. 4B to 4D are cross-sectional views, showing one example of steps for fabricating the interposer of FIG. 1.
Figure 4B:
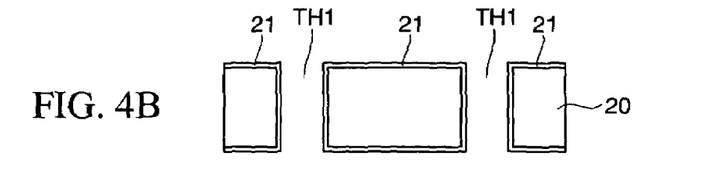
Figure 4C:
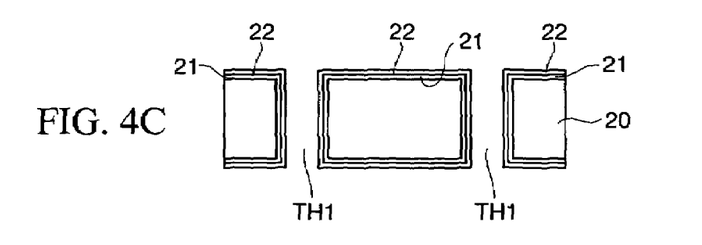
Figure 4D:
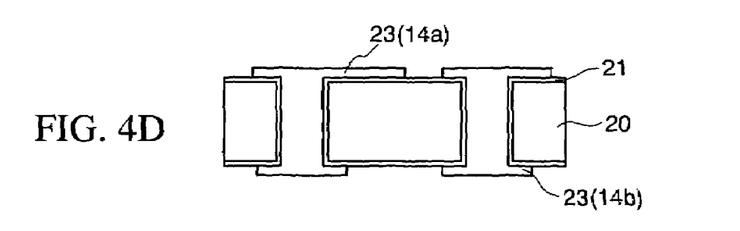

The wiring patterns 23 formed here correspond to the wiring patterns 14a and 14b shown in FIG. 1. In the illustrated example, there are formed two layers of wiring patterns 23 in total, one layer on each surface (on the insulating layer 21) of the Si wafer 20. However, it is a matter of course that the number of layers of wiring patterns to be formed is not limited to two. The number of layers of wiring may be appropriately increased by a build-up process or the like, as needed.

In the next step (FIG. 5A), the Si wafer 20 with the wiring patterns 23 formed on both surfaces thereof is cut into individual shapes (in this embodiment, the shapes of Si chips 1 to be mounted) of Si interposer portions 11 as seen two-dimensionally, for example, using a dicer, to be divided into individual pieces, each corresponding to one interposer.

In the next step (FIG. 5B), a supporting body 24 is prepared in which an insulating film 25 made of epoxy resin, polyimide resin, or the like, is formed on one surface thereof. On the insulating film 25 of the supporting body 24, the Si interposer portions 11 (each of which is part of the interposer 10) which have been obtained as individual pieces in the preceding step are arranged at a predetermined regular interval therebetween. The supporting body 24 may be made of a metal body, or may be in the form of a tape member or the like. In the latter case, it is desirable that the surface of the tape member on which the insulating film 25 is to be formed is coated with a release agent. That is because such an agent makes it convenient when the supporting body 24 is stripped off and removed in a later stage.

In the next step (FIG. 5C), resin is filled into the gaps between the Si interposer portions 11 to form a resin layer 26. Further, an insulating film 27 is formed on the Si interposer portions 11 and the resin layer 26 by CVD, lamination, or the like. For example, the resin layer 26 can be formed as follows: a low-viscosity thermosetting epoxy resin is melted and poured into the gaps between the Si interposer portions 11, and directly subjected to hot pressing from above.

Part of the resin layer 26 formed here constitute the extended interposer portions 12 shown in FIG. 1. Further, the insulating films 27 and 25 formed on both surfaces of the Si interposer portions 11 and the resin layer 26 with the Si interposer portions 11 and the resin layer 26 interposed therebetween correspond to the insulating layers 13a and 13b shown in FIG. 1, respectively.

In the next step (FIG. 5D), the supporting body 24 (FIG. 5C) is removed by wet etching (in the case of a metal), stripping-off (in the case of a tape member), or the like.

In the next step (FIG. 6A), through holes TH2 are formed at required positions in the resin layer 26 (including the insulating films 25 and 27), for example, using a mechanical drill, a UV-YAG laser, a $CO_2$ laser, or an excimer laser. Further, via holes VH are formed on required portions (pad portions) of the wiring patterns 23 of the Si interposer portions 11 so as to reach the pad portions, for example, using a laser.

In the next step (FIG. 6B), a seed layer (Cu) is formed on the entire surfaces of the insulating films 25 and 27 including the insides of the through holes TH2 and the via holes VH by electroless plating, sputtering, or the like. Using the seed layer as a power-supplying layer, the through holes TH2 and the via holes VH are filled by electrolytic Cu plating (alternatively, conductive paste containing metal such as Cu is filled into the through holes TH2 by screen printing, inkjet printing, or the like). Then, Cu wiring patterns 28 having required shapes are formed by a subtractive process, a semi-additive process, inkjet printing, or the like, so as to connect the conductors filled in the through holes TH2 and the pad portions of the wiring patterns 23 which are exposed from the via holes VH.

Figure 6A:
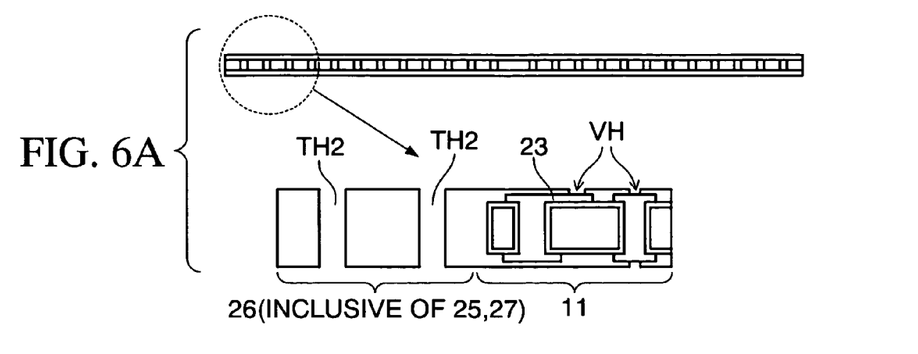
FIGS. 6A to 6C are cross-sectional views showing fabrication steps subsequent to those of FIGS. 5A to 5D.
Figure 6B:
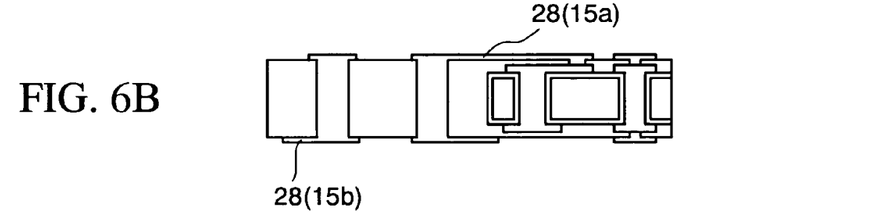
Figure 6C:
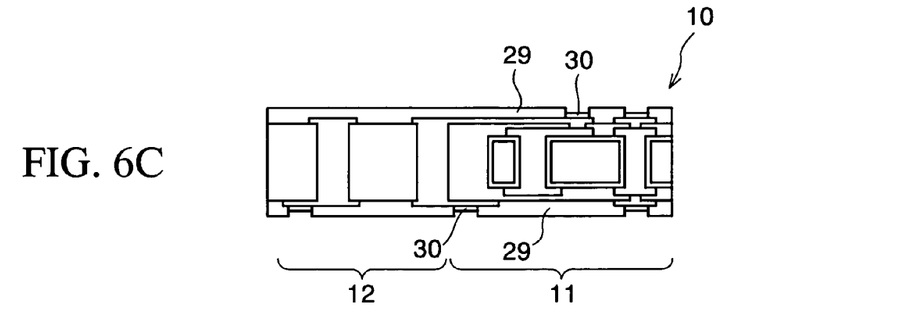

The wiring patterns 28 formed here correspond to the wiring patterns 15a and 15b shown in FIG. 1.

In the final step (FIG. 6C), solder resist layers 29 are formed to cover the entire surface in such a manner that the pad portions delimited at required positions in the wiring patterns 28 on both surfaces are exposed. Further, the pad portions (Cu) exposed from the solder resist layers 29 are plated with Ni/Au (formation of plated Ni/Au layers 30). This is intended to obtain improved adhesiveness with the pad portions when solder bonding is performed in a later stage. Furthermore, portions of the resin layer 26 (including the insulating films 25 and 27) are cut in such a manner that specified areas for the extended interposer portions 12 (FIG. 1) are delimited, thereby separating pieces, each including one Si interposer portion 11.

By the above-described steps, the interposer 10 according to this embodiment is fabricated. Incidentally, after the plated Ni/Au layers 30 have been formed in the final step, solder bumps to be used as the external connection terminals 16 (FIG. 1) may be formed on the pad portions (one plated Ni/Au layer 30) which are exposed from one solder resist layer 29, as needed.

As described above, according to the interposer 10 (FIG. 1) of this embodiment and the method of fabricating the same, the Si interposer portion 11 has a size approximately equal to that of the Si chip 1 to be mounted thereon. Accordingly, it is possible to match its coefficient of thermal expansion (CTE) matching with that of the Si chip 1. On the other hand, the extended interposer portion 12 provided in an area (i.e., an area which is essentially unnecessary from the viewpoint of CTE matching with the Si chip 1 to be mounted) around the Si interposer portion 11 is made of an insulator (epoxy resin). Accordingly, Si does not need to be used for an unnecessary area as heretofore, and the amount of Si used can be reduced to a required minimum. Thus, cost can be reduced. Further, the presence of the extended interposer portion 12 makes it possible to realize a required fan-out structure.

Moreover, in relation to this, since a stress occurring between the Si chip 1 and the Si interposer portion 11 can be relaxed by CTE matching, flexibility can be improved in selecting the material constituting the extended interposer portion 12.

Moreover, in the fabricating method (FIGS. 4A to 6C) according to this embodiment, processing is performed after the Si interposer portions 11 have been cut and separated from the Si wafer 20 and re-laid out on the supporting body 24. Accordingly, unlike the case where processing is performed on the whole Si wafer without cut and separation of the Si interposer portions as heretofore, required wiring patterns can be easily formed on both surfaces of the interposer 10.

Moreover, since the external connection terminals 16 can be bonded to the pad portions of the wiring patterns which are exposed from one solder resist layer (protective film) 29 as needed, a plurality of interposers 10 (with Si chips 1 mounted thereon) can be stacked in a multilayered manner as shown in FIG. 3.

Figure 5A:
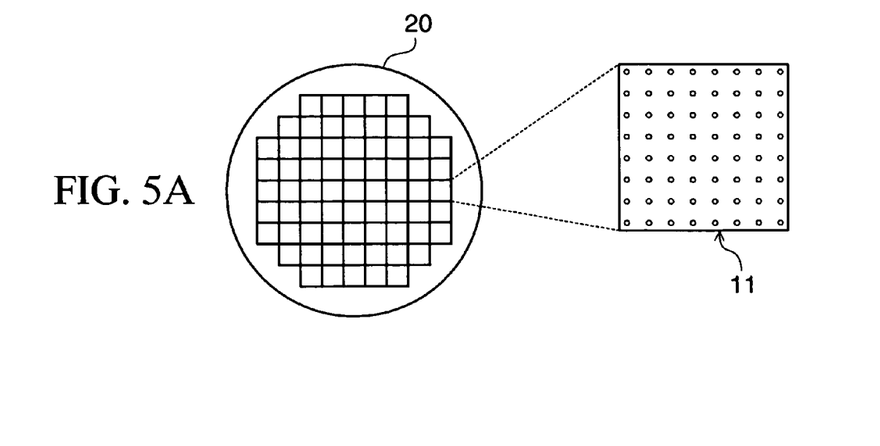
FIG. 5A is a plan view and FIGS. 5B to 5D are cross-sectional views, showing fabrication steps subsequent to those of FIGS. 4A to 4D.
Figure 5B:
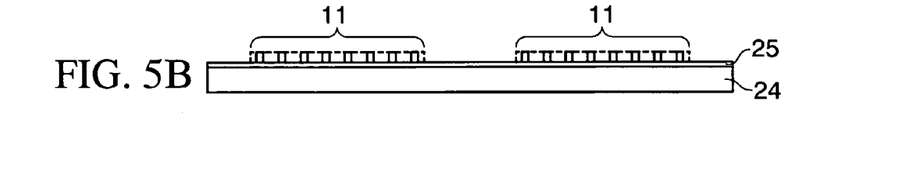
Figure 5C:
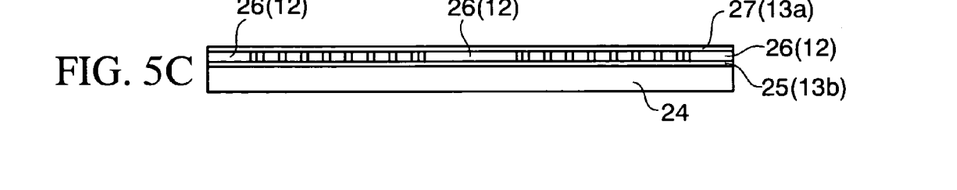
Figure 5D:
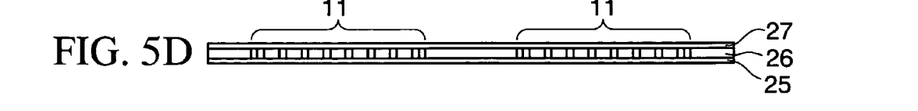

Moreover, even if a stress such as a warp or a twist occurs when the Si wafer is thinned prior to the formation of the through holes TH1 in the step of FIG. 4A, the stress can be removed by dicing to be performed in a later stage (FIG. 5A). Accordingly, the processing becomes easy due to the thin Si wafer. This can contribute to a reduction in the thickness of the interposer 10.

Furthermore, where the formation of through holes is carried out only in the resin area (area of the extended interposer portion 12), a wiring board process can be used for processing the through holes and for forming electrical paths in the through holes. Accordingly, the process can be simplified. This makes it possible to reduce cost and to shorten a procedure.

In the above-described embodiment (FIG. 1), the description has been made by taking as an example the case where the extended interposer portion 12 provided around the Si interposer portion 11 is made of an insulator (epoxy resin). However, it is a matter of course that the material constituting the extended interposer portion 12 is not limited to this. For example, the extended interposer portion 12 can also be made of a metal body instead of an insulator.

Hereinafter, an embodiment for the case where the extended interposer portion is made of a metal body will be described. Incidentally, the constitution of an interposer according to this embodiment is the same as that of the interposer 10 shown in FIG. 1 in terms of the appearance, and therefore will not be further described here.

In addition to the advantages obtained by the above embodiment, the constitution of the interposer (for the case where the extended interposer portion is made of a metal body) according to this embodiment also provides the advantage in that heat generated inside can be dissipated into the outside environment when the interposer is constituted as a semiconductor device, because the extended interposer portion is made of a metal body.

Hereinafter, a method of fabricating the interposer provided with the extended interposer portion made of a metal body will be described with reference to FIGS. 7A to 9C showing one example of a fabricating process thereof.

First, of the fabricating process according to the above embodiment, the steps of FIGS. 4A to 5A are performed. In the next step (FIG. 7A), through holes TH3 are formed at required positions in a metal plate 40 of aluminum (Al), copper (Cu), or the like, having a predetermined thickness (approximately 50 to 300 μm) by wet etching; a hole-making process using a mechanical drill; laser processing using a UV-YAG laser, a $CO_2$ laser, an excimer laser, or the like. In doing so, an opening portion for accommodating the Si interposer portion 11 may be simultaneously formed.

In the next step (FIG. 7B), an insulating layer 41 made of epoxy resin, polyimide resin, or the like, is formed on the entire surface including the inner walls of the through holes TH3, for example, by electrophoretic deposition.

In the next step (FIG. 7C), a seed layer 42 of copper (Cu) is formed on the entire surface of the insulating layer 41, for example, by electroless plating, sputtering, or vapor deposition.

In the next step (FIG. 7D), the through holes TH3 are filled with conductors, and wiring patterns 43 having required shapes are formed on both surfaces so as to be connected to these conductors. For example, using the seed layer 42 as a power-supplying layer, the through holes TH3 are filled by electrolytic Cu plating. Alternatively, conductive paste containing metal such as Cu is filled into the through holes TH3 by screen printing, inkjet printing, or the like. Further, Cu wiring patterns 43 having required shapes are formed on the filled conductors by a subtractive process, a semi-additive process, inkjet printing, or the like. Where a semi-additive process or inkjet printing is used, the wiring patterns 43 can be formed simultaneously with the filling of the through holes TH3 with conductors (Cu) (simplification of process).

Figure 7A:
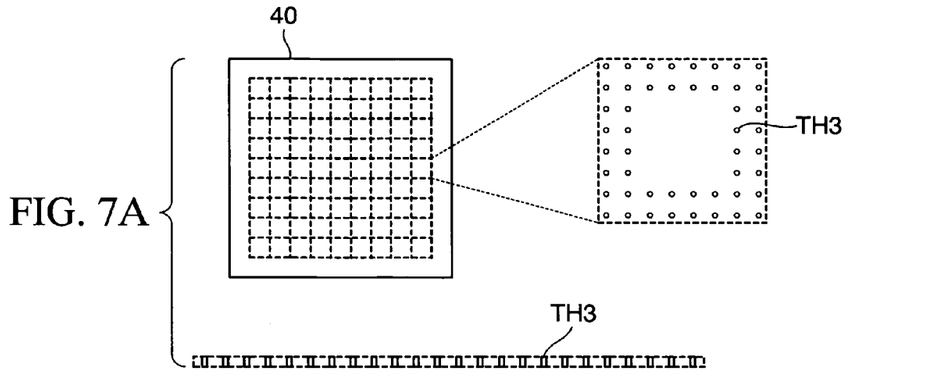
FIG. 7A is a plan view and FIGS. 7B to 7D are cross-sectional views, showing one example of steps for fabricating an interposer (in the case of the extended interposer portion being made of a metal body) according to another embodiment of the present invention.
Figure 7B:
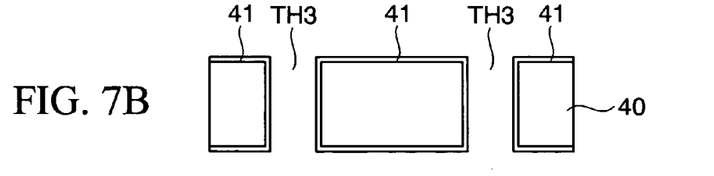
Figure 7C:
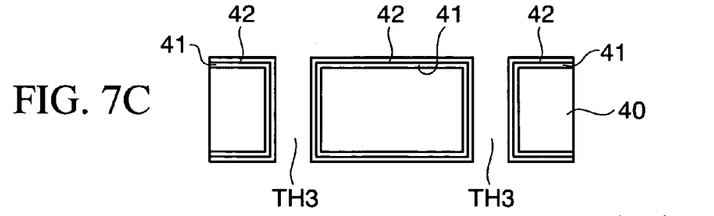
Figure 7D:
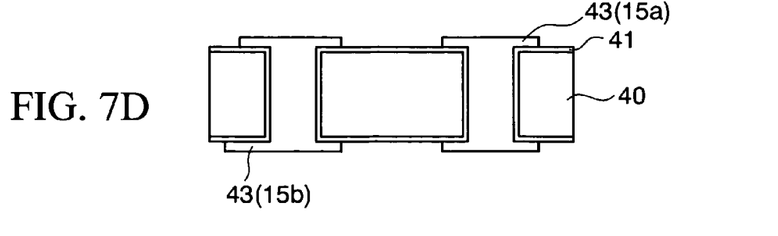

The wiring patterns 43 formed here correspond to the wiring patterns 15a and 15b shown in FIG. 1. In the illustrated example, there are formed two layers of wiring patterns 43 in total, one layer on each surface (on the insulating layer 41) of the metal plate 40. However, it is a matter of course that the number of layers of wiring patterns to be formed is not limited to two. The number of layers of wiring may be appropriately increased by a build-up process or the like, as needed.

In the next step (FIG. 8A), for example, using a dicer, the metal plate 40 with the wiring patterns 43 formed on both surfaces thereof is cut into the shapes of required extended interposer portions 12a (part of the interposer), i.e., "frame-like" shapes in which an opening portion OP for accommodating the Si interposer portion 11 is formed as shown in the drawing, to be divided into individual pieces, each corresponding to one interposer. Incidentally, the opening portion for accommodating the Si interposer portion 11 is formed by cutting using a dicer or the like in this step. However, before or after cutting using the dicer or the like, the opening portion may be formed by stamping using a press or the like.

In the next step (FIG. 8B), a supporting body 44 is prepared with an insulating film 45 made of epoxy resin, polyimide resin, or the like, formed on one surface thereof. On the insulating film 45 of the supporting body 44, the Si interposer portions 11 already obtained as individual pieces and the extended interposer portions 12a obtained as individual pieces in the preceding step are arranged. In doing so, the Si interposer portion 11 is arranged in such a manner that it is accommodated in the opening portion OP formed in the extended interposer portion 12a. The supporting body 44 may be made of a metal body, or may be in the form of a tape member or the like (here, the surface thereof on which the insulating film 45 is formed is coated with a release agent).

In the next step (FIG. 8C), an insulating film 46 is formed on the entire surface including the spaces between the Si interposer portions 11 and the extended interposer portions 12a and the spaces between adjacent extended interposer portions 12a, by CVD, lamination, or the like. Alternatively, thermosetting resin may be applied to the entire surface and cured to form the insulating film 46.

The insulating film 46 formed here and the insulating film 45 formed in the preceding step correspond to the insulating layers 13a and 13b shown in FIG. 1, respectively.

In the next step (FIG. 8D), the supporting body 44 (FIG. 8C) is removed by wet etching (in the case of a metal), stripping-off (in the case of a tape member), or the like.

In the next step (FIG. 9A), via holes VH1 and VH2 are formed on required portions (pad portions) of the wiring patterns 23 and 43 of the Si interposer portions 11 and the extended interposer portions 12a so as to reach the pad portions, for example, using a UV-YAG laser, a $CO_2$ laser, or an excimer laser.

In the next step (FIG. 9B), Cu wiring patterns 47 having required shapes are formed by a subtractive process, a semi-additive process, screen printing using conductive paste, or the like, so as to connect the pad portions of the wiring patterns 23 which are exposed from the via holes VH1 formed in the Si interposer portions 11 and the pad portions of the wiring patterns 43 which are exposed from the via holes VH2 formed in the extended interposer portions 12a.

Figure 9A:
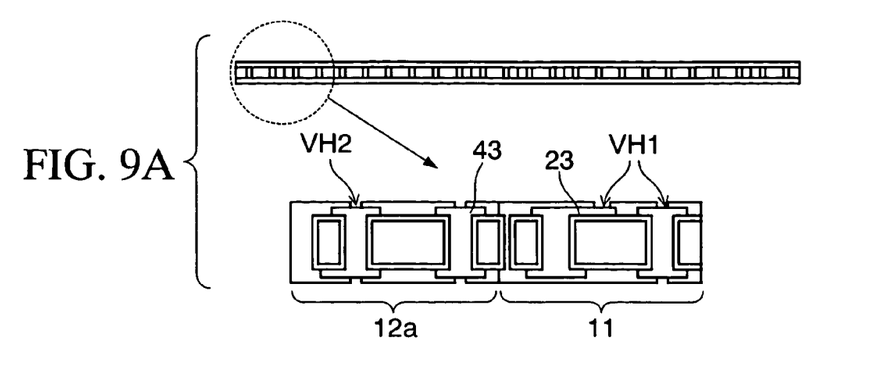
FIGS. 9A to 9C are cross-sectional views showing fabrication steps subsequent to those of FIGS. 8A to 8D.
Figure 9B:
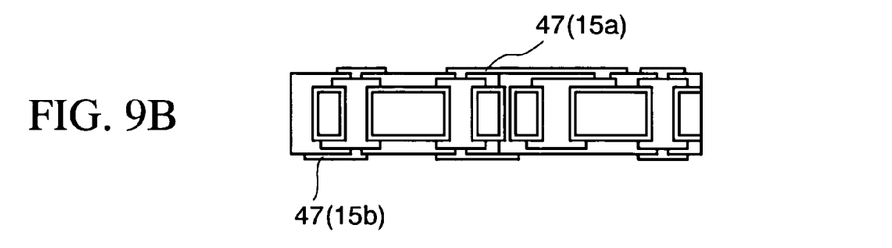
Figure 9C:
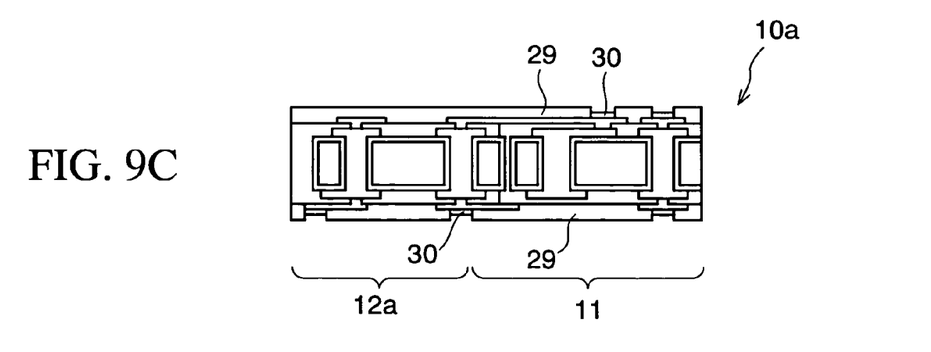
Figure 10A:
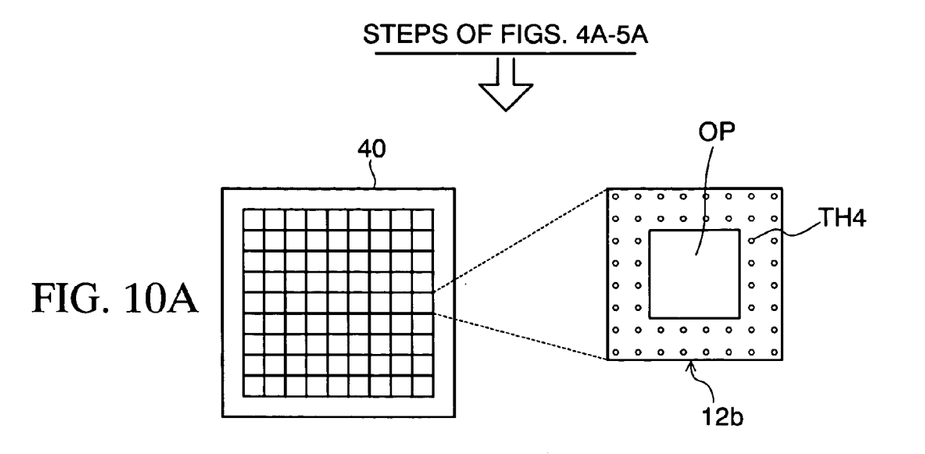
FIG. 10A is a plan view and FIGS. 10B to 10D are cross-sectional views, showing another example of steps for fabricating an interposer (in the case of the extended interposer portion being made of a metal body) according to another embodiment of the present invention.
Figure 10B:
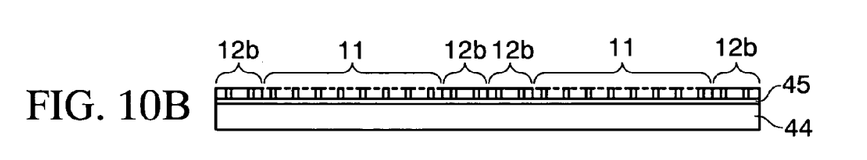
Figure 10C:
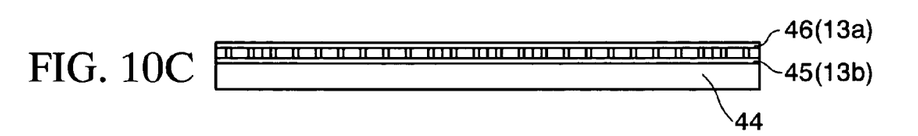
Figure 10D:
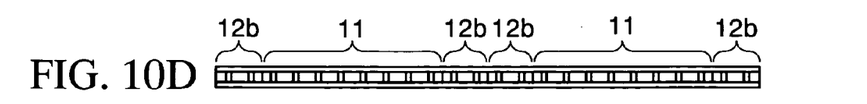

The wiring patterns 47 formed here correspond to the wiring patterns 15a and 15b shown in FIG. 1.

In the final step (FIG. 9C), solder resist layers 29 are formed to cover the entire surface in such a manner that the pad portions delimited at required positions in the wiring patterns 47 on both surfaces are exposed. Further, the pad portions (Cu) exposed from the solder resist layers 29 are plated with Ni/Au (formation of plated Ni/Au layers 30). Furthermore, insulating film portions around the extended interposer portions 12a are cut, thereby separating pieces, in such a manner that one Si interposer portion 11 and the extended interposer portion 12a placed around the Si interposer portion 11 are included in each piece.

By the above-described steps, the interposer 10a according to this embodiment is fabricated. As in the case of the aforementioned embodiment, after the plated Ni/Au layers 30 have been formed in the final step, solder bumps (external connection terminals 16 in FIG. 1) may be formed on the pad portions (one plated Ni/Au layer 30) which are exposed from one solder resist layer 29, as needed.

Next, a method of fabricating an interposer according to another embodiment for the case where the extended interposer portion is made of a metal body will be described with reference to FIGS. 10A to 11D.

First, the steps of FIGS. 4A to 5A are performed. In the next step (FIG. 10A), through holes TH4 are formed at required positions in a metal plate 40 of aluminum (Al), copper (Cu), or the like, having a predetermined thickness (approximately 50 to 300 μm) by wet etching; a hole-making process using a mechanical drill; laser processing using a $CO_2$ laser, an excimer laser, or the like. Furthermore, the metal plate 40 is cut into the shapes of required extended interposer portions 12b, i.e., "frame-like" shapes in which an opening portion OP for accommodating the Si interposer portion 11 is formed as shown in the drawing, to be divided into individual pieces, each corresponding to one interposer.

Figure 8A:
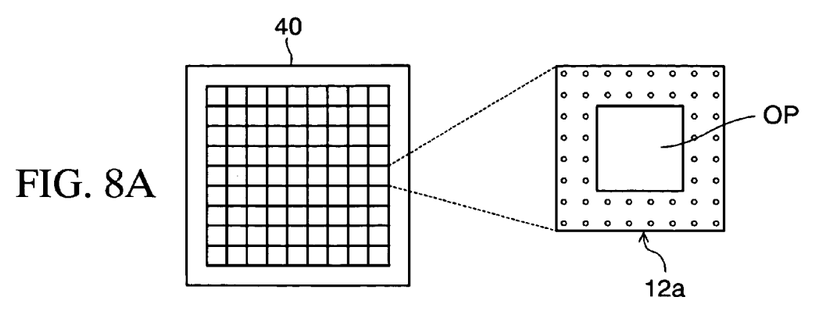
FIG. 8A is a plan view and FIGS. 8B to 8D are cross-sectional views, showing fabrication steps subsequent to those of FIGS. 7A to 7D.
Figure 8B:
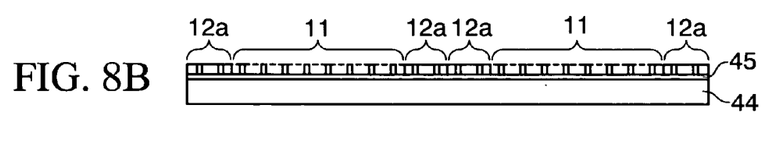
Figure 8C:
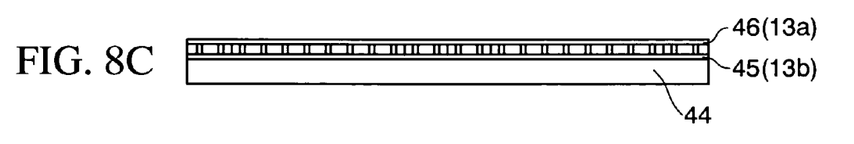
Figure 8D:
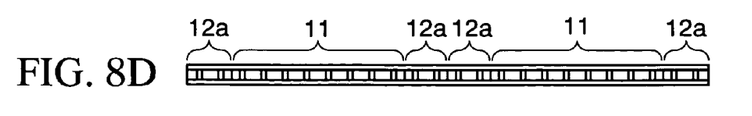

In the next step (FIG. 10B), as in the process performed in the step of FIG. 8B, a supporting body 44 is prepared in which an insulating film 45 made of epoxy resin, polyimide resin, or the like, is formed on one surface thereof. On the insulating film 45 of the supporting body 44, the Si interposer portions 11 already obtained as individual pieces and the extended interposer portions 12b obtained as individual pieces in the preceding step are arranged. In doing so, the Si interposer portion 11 is arranged in such a manner that it is accommodated in the opening portion formed in the extended interposer portion 12b. The supporting body 44 may be made of a metal body, or may be in the form of a tape member or the like (here, the surface thereof on which the insulating film 45 is formed is coated with a release agent).

In the next step (FIG. 10C), an insulating film 46 is formed on the entire surface including the spaces between the Si interposer portions 11 and the extended interposer portions 12b and the spaces between adjacent extended interposer portions 12b, by CVD, lamination, or the like. At this time, the insulating film is also formed (filled) in the through holes TH4 formed in the metal plate 40. Incidentally, the insulating film 46 may be formed by applying and curing thermosetting resin. The insulating film 46 formed here and the insulating film 45 formed in the preceding step correspond to the insulating layers 13a and 13b shown in FIG. 1, respectively.

In the next step (FIG. 10D), the supporting body 44 (FIG. 10C) is removed by wet etching (in the case of a metal), stripping-off (in the case of a tape member), or the like.

In the next step (FIG. 11A), through holes TH5 are formed at predetermined positions (positions of the through holes TH4 filled with an insulating film) in the extended interposer portions 12b, for example, using a UV-YAG laser, a $CO_2$ laser, or an excimer laser. Furthermore, via holes VH3 are formed on required portions (pad portions) of the wiring patterns 23 of the Si interposer portions 11 so as to reach the pad portions, for example, using a laser.

In the next step (FIG. 11B), a seed layer (Cu) is formed on the entire surface including the insides of the through holes TH5 by electroless plating, sputtering, or the like. Using this seed layer as a power-supplying layer, the through holes TH5 are filled by electrolytic Cu plating. Alternatively, conductive paste (conductors 48) containing metal such as Cu is filled into the through holes TH5 by screen printing, inkjet printing, or the like.

Figure 11A:
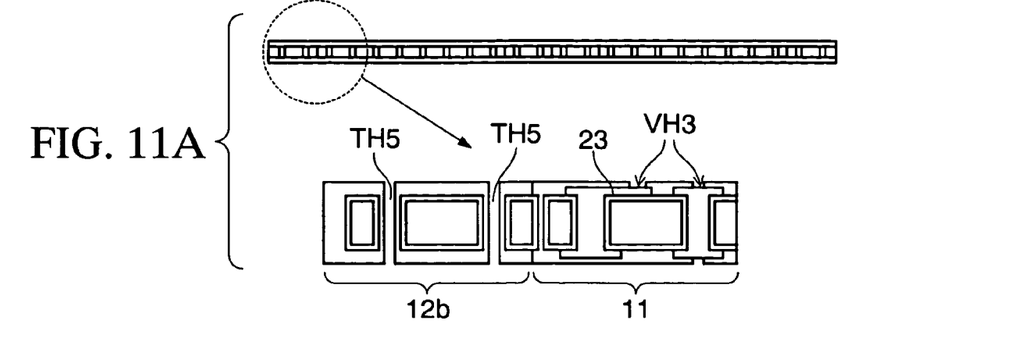
FIGS. 11A to 11D are cross-sectional views showing fabrication steps subsequent to those of FIGS. 10A to 10D.
Figure 11B:
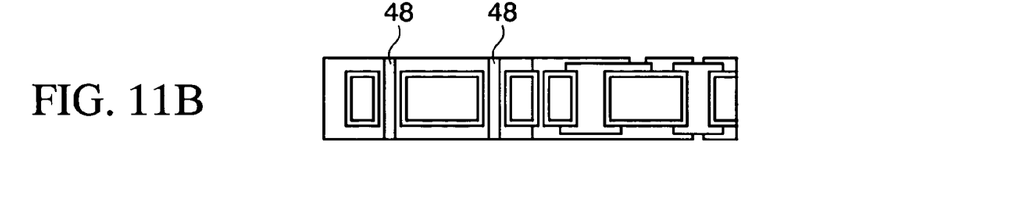
Figure 11C:
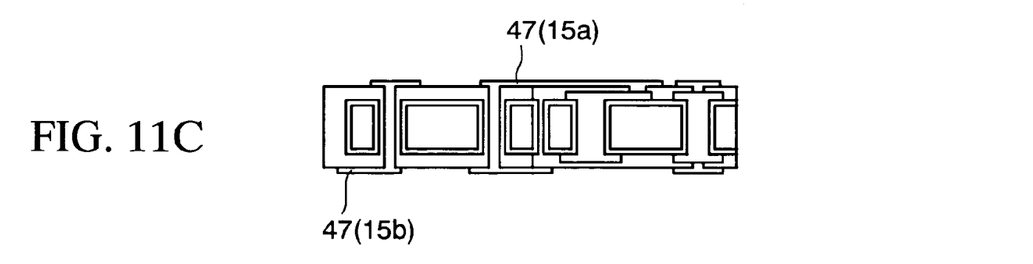
Figure 11D:
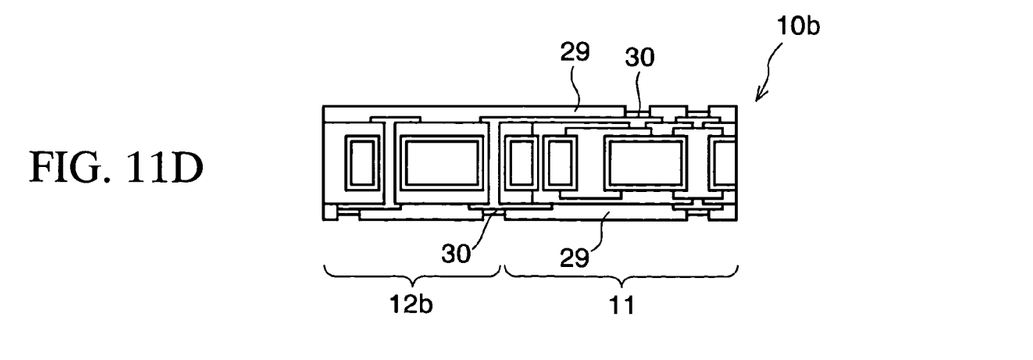

In the next step (FIG. 1C), Cu wiring patterns 47 having required shapes are formed by a subtractive process, a semi-additive process, inkjet printing, or the like, so as to connect the conductors 48 filled in the through holes TH5 and the pad portions of the wiring patterns 23 which are exposed from the via holes VH3.

The wiring patterns 47 formed here correspond to the wiring patterns 15a and 15b shown in FIG. 1.

In the final step (FIG. 11D), solder resist layers 29 are formed to cover the entire surface in such a manner that the pad portions delimited at required positions in the wiring patterns 47 on both surfaces are exposed. Further, the pad portions (Cu) exposed from the solder resist layers 29 are plated with Ni/Au (formation of plated Ni/Au layers 30). Furthermore, insulating film portions around the extended interposer portions 12b are cut to be separated into pieces, in such a manner that one Si interposer portion 11 and the extended interposer portion 12b placed around the Si interposer portion 11 are included in each piece.

By the above-described steps, the interposer 10b according to this embodiment is fabricated. As in the aforementioned embodiments, after the plated Ni/Au layers 30 have been formed in the final step, solder bumps (external connection terminals 16 in FIG. 1) may be formed on the pad portions (one plated Ni/Au layer 30) which are exposed from one solder resist layer 29, as needed.

What is claimed is:

1. An interposer to be interposed between a semiconductor chip to be mounted thereon and a packaging board, the interposer comprising:

a first interposer portion formed of a first material having a thermal expansion coefficient equivalent to that of the semiconductor chip to be mounted thereon;

a second interposer portion formed of a second material different from said first material and provided around the first interposer portion integrally therewith, both upper and lower surfaces of the second interposer portion being on a level with those of the first interposer position; and insulating layers formed on both upper and lower surfaces of the first and second interposer portions, wherein wiring patterns are formed on said insulating layers, and are electrically connected via through holes formed at required positions in the first and second interposer portions, and wherein the first interposer portion has a size approximately equal to that of the semiconductor chip to be mounted thereon.

2. The interposer according to claim 1, wherein the both surfaces of the first and second interposer portions are covered with protective films in such a manner that a plurality of pad portions delimited at required positions in the wiring patterns are exposed.

3. The interposer according to claim 2, wherein external connection terminals are bonded to a required number of pad portions among the plurality of pad portions exposed from the protective films.

4. The interposer according to claim 1, wherein the first interposer portion is made of a semiconductor material.

5. The interposer according to claim 1, wherein the first interposer portion is made of a low firing temperature ceramic.

6. The interposer according to claim 1, wherein the second interposer portion is made of resin.

7. The interposer according to claim 1, wherein the second interposer portion is made of a metal.

8. The interposer according to claim 1, wherein the first interposer portion has a size approximately equal to that of the semiconductor chip to be mounted thereon, when viewed two-dimensionally.

9. A semiconductor device wherein a semiconductor chip is mounted on the interposer according to any one of claims 1 to 8 and is electrically connected to the wiring patterns.

10. A semiconductor device wherein a required number of semiconductor devices each according to claim 9 are stacked and electrically connected to each other.

* * * * *